(12) United States Patent
Dvoskin et al.

(10) Patent No.: US 10,497,404 B2
(45) Date of Patent: Dec. 3, 2019

(54) CLAMPING CIRCUIT

(71) Applicant: Hewlett-Packard Development Company, L.P., Houston, TX (US)

(72) Inventors: Eugene Mikhaylovich Dvoskin, Broomfield, CO (US); Noel D. Scott, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 309 days.

(21) Appl. No.: 15/515,992

(22) PCT Filed: Oct. 3, 2014

(86) PCT No.: PCT/US2014/059027
§ 371 (c)(1),
(2) Date: Mar. 30, 2017

(87) PCT Pub. No.: WO2016/053349
PCT Pub. Date: Apr. 7, 2016

(65) Prior Publication Data
US 2017/0310156 A1 Oct. 26, 2017

(51) Int. Cl.
*G11C 5/14* (2006.01)
*H02M 1/34* (2007.01)
*G06F 1/30* (2006.01)

(52) U.S. Cl.
CPC ............. *G11C 5/145* (2013.01); *H02M 1/34* (2013.01); *G06F 1/30* (2013.01); *H02M 2001/342* (2013.01); *Y02B 70/1491* (2013.01)

(58) Field of Classification Search
CPC ............................................ G11C 5/14–148
See application file for complete search history.

(56) References Cited

U.S. PATENT DOCUMENTS

| | | | |
|---|---|---|---|
| 4,422,163 A * | 12/1983 | Oldenkamp | G11C 5/141 365/229 |
| 5,128,555 A | 7/1992 | Millman | |
| 5,760,625 A * | 6/1998 | Macks | G06F 1/24 327/143 |
| 6,201,731 B1 | 3/2001 | Kamp et al. | |
| 6,721,150 B1 | 4/2004 | Guerrero et al. | |
| 8,427,223 B2 | 4/2013 | Kumar et al. | |
| 8,427,886 B2 | 4/2013 | Goel et al. | |
| 8,553,472 B2 | 10/2013 | McCombs et al. | |
| 2004/0001359 A1 * | 1/2004 | Ott | G11C 5/143 365/185.18 |
| 2006/0139978 A1 | 6/2006 | Hsieh et al. | |

(Continued)

FOREIGN PATENT DOCUMENTS

TW 200801924 1/2008
TW M441288 11/2012

OTHER PUBLICATIONS

Dual Mobile-Friendly PWM Controller with DDR Option, ISL6227, Data Sheet, FN9094.7, May 4, 2009, pp. 1-27, Intersil, Available at: <intersil.com/content/dam/Intersil/documents/isl6/isl6227.pdf>.

*Primary Examiner* — Rexford N Barnie
*Assistant Examiner* — David A Shiao
(74) *Attorney, Agent, or Firm* — Fabian VanCott

(57) ABSTRACT

A clamping circuit includes an energy storage section and a pulse generator to generate a pulse in which the energy storage section stores energy from a main power supply.

18 Claims, 3 Drawing Sheets

(56) References Cited

U.S. PATENT DOCUMENTS

| | | |
|---|---|---|
| 2006/0294437 A1 | 12/2006 | Washburn et al. |
| 2007/0241732 A1 | 10/2007 | Luo et al. |
| 2008/0122500 A1* | 5/2008 | Suzuki .................... G06F 1/24 327/143 |
| 2009/0097281 A1 | 4/2009 | Lin |
| 2009/0193278 A1* | 7/2009 | Camilleri ............... G06F 1/305 713/340 |
| 2010/0008175 A1* | 1/2010 | Sweere ............. G06F 12/0866 365/229 |
| 2010/0146333 A1* | 6/2010 | Yong ..................... G06F 1/305 714/14 |
| 2012/0014169 A1* | 1/2012 | Snider ................... G11C 5/141 365/148 |
| 2012/0102310 A1* | 4/2012 | Shim ..................... G11C 16/22 713/2 |
| 2014/0254235 A1* | 9/2014 | Rahman ................ G11C 5/148 365/145 |
| 2015/0357005 A1* | 12/2015 | Shim ..................... G11C 5/141 365/228 |

\* cited by examiner

CLAMPING CIRCUIT

CROSS-REFERENCE TO RELATED APPLICATION

This application is a U.S. National Stage Application of and claims priority to International Patent Application No. PCT/US2014/059027, filed on Oct. 3, 2014, and entitled "A CLAMPING CIRCUIT," which is hereby incorporated by reference in its entirety.

BACKGROUND

Electronic systems such as computers, mobile phones, servers, as well as other electronic systems use a number of electronic components to perform functions of the electronic system. An example of an electronic component may be memory. Memory performs the function of storing data for the electronic system. Individual components or groups of components may use multiple electric power supplies. These components or groups of components may specify that the power is supplied at different voltage levels. The components may further specify that voltage and timing relationships between the multiple electrical power sources be controlled.

BRIEF DESCRIPTION OF THE DRAWINGS

The accompanying drawings illustrate various examples of the principles described herein and are a part of the specification. The examples do not limit the scope of the claims.

Throughout the drawings, identical reference numbers designate similar, but not necessarily identical, elements.

DETAILED DESCRIPTION

Figure 1:
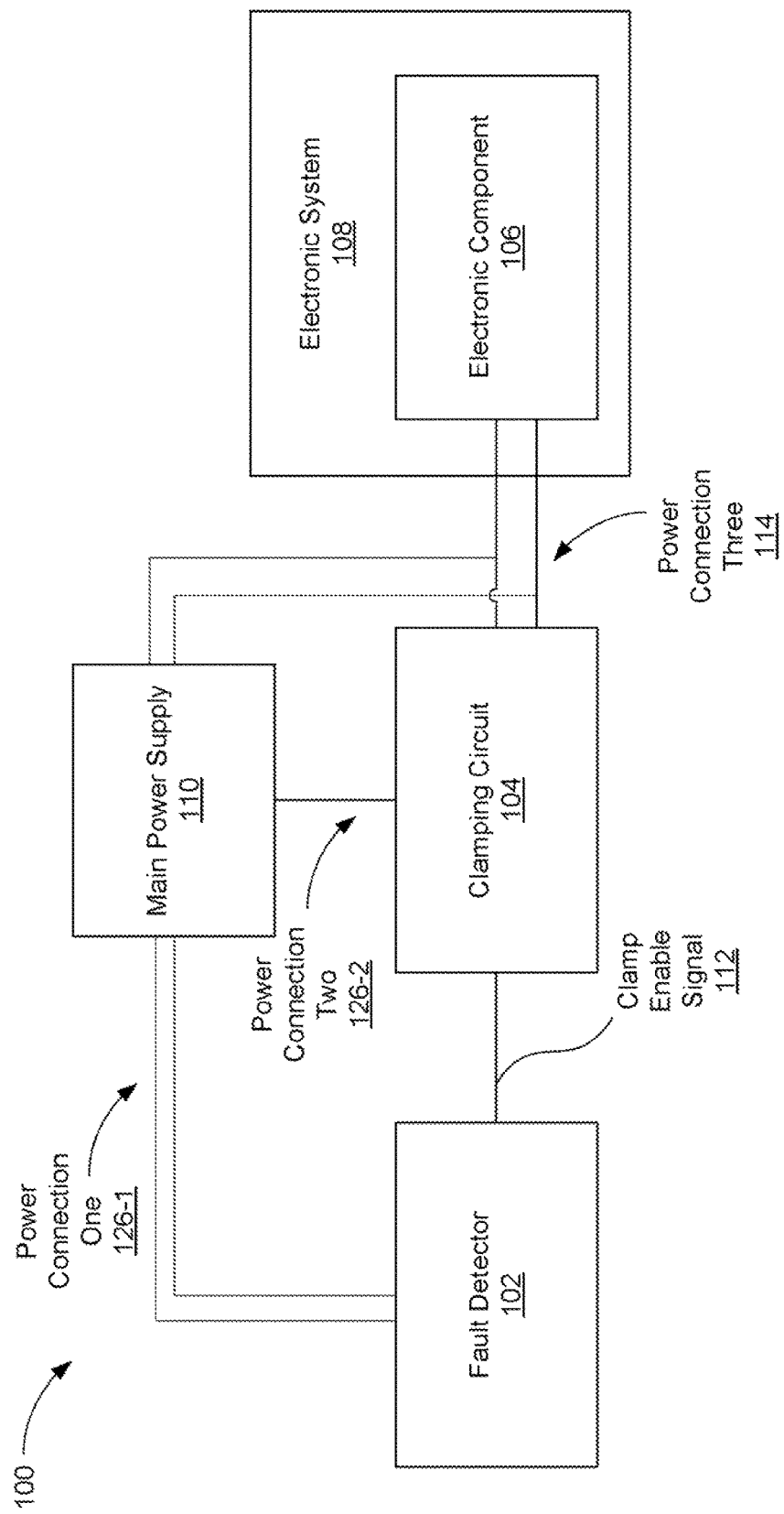
FIG. 1 is a diagram of an example of a system for controlling power connection voltage to an electronic component during a power down sequence of an electronic system, according to one example of principles described herein.

As mentioned above, electronic systems such as computers, mobile phones, servers, as well as other electronic systems use a number of electronic components to perform functions of the electronic system. An electronic component, such as memory, performs the function of storing data for the electronic system. Further, electronic components may use multiple power sources and may need voltages of those multiple power sources to be controlled relative to each other.

Often, the electronic components need their power supply voltages be controlled in terms of voltages relative to ground and to each other. Control voltages may become especially difficult during a power down sequence of the electronic system. If the electronic components are not supplied with specific voltages from each power supply and specific voltage relationships between specific power supplies during a power down sequence of the electronic system, the electronic components may be permanently damaged. As a result, the electronic components may be unusable.

The principles described herein include a clamping circuit for controlling multiple power supplies to an electronic component during a power down sequence of an electronic system. Such a clamping circuit includes an energy storage section and a pulse generator. The energy storage section stores energy from a main power supply and is later used during a power down sequence to power an electronic component. Such a clamping circuit allows an electronic component of an electronic system, which is powered by multiple power supplies, to maintain a specific voltage relationship between the multiple power supplies of the electronic component during a power down sequence of an electronic system. As a result, the electronic component may not be permanently damaged during a power down sequence.

In the present specification and in the appended claims, the term "power down sequence" is meant to be understood broadly as an electronic system turning off. In an example, a power down sequence may be planned and well-controlled when the electronic system is powered down. In another example, a power down sequence may be abrupt when the electronic system suddenly loses power.

In the present specification and in the appended claims, the term "fault detector" is meant to be understood broadly as a mechanism to detect when a power down sequence is activated. In an example, when a power down sequence is activated the fault detector sends a clamp enable signal to a clamping circuit. In an example, the fault detector sends a clamp enable signal that uses a low voltage to enable the clamping circuit In the present specification and in the appended claims, the term "energy storage section" is meant to be understood broadly as a number of elements of the clamping circuit that stores enough energy to power an electronic component, according to the needs of the electronic component, during a power down sequence. In an example, the energy storage section may include a diode and a capacitor. In an example, the diode isolates a voltage produced by a main power supply and the capacitor stores the voltage.

In the present specification and in the appended claims, the term "pulse" is meant to be understood broadly as time-limited energy supplied from the energy storage section. In an example, a pulse generator creates a pulse within a specific voltage range and for a specific range of time duration In an example, the pulse generator may include a number of elements of the clamping circuit used to generate the pulse at a specific voltage range and for a specific range or time duration.

Further, as used in the present specification and in the appended claims, the term "a number of" or or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Referring now to the figures, FIG. 1 is a diagram of an example of a system for controlling power connection voltage to an electronic component during a power down sequence of an electronic system, according to one example of principles described herein. As will be described below, a clamping circuit may be used to for controlling voltage relationships between multiple power supplies to an electronic component during a power down sequence of an electronic system. The clamping circuit may include an energy storage section to store energy from a main power supply and a pulse generator to generate a pulse using the energy storage section to turn on the clamping circuit during a power down sequence of an electronic system.

In one example, the system (100) includes an electronic system (108). In an example, the electronic system (108) may be a computer, a mobile phone, a server, or another type of electronic system. As illustrated, the electronic system (108) includes an electronic component (106). The electronic component (106) is used to perform specific functions of the electronic system (108). In an example, the electronic component (106) may be memory such as double data rate fourth generation (DDR4) random access memory (RAM). In this example. DDR4 RAM performs the function of storing data for the electronic system (108). As will be described in other parts of this specification, the electronic component (106) may need to be supplied with electric power at multiple specific voltages, or permanent damage may be caused to the electronic component (106).

As illustrated in FIG. 1, the system (100) includes a main power supply (110). In an example, the main power supply (110) supplies power to a clamping circuit (104), a fault detector (102), the electronic component (106), or combinations thereof. As illustrated, the main power supply (110) supplies power to the clamping circuit (104) via power connection two (126-2). In an example, power connection two (126-2) may include at least one wire. Still further, the main power supply (110) supplies power to the fault detector (102) via power connection one (126-1). In an example, power connection one (126-1) may include a number of wires. For example, power connection one (126-1) may include a two wires. As will be described in other parts of this specification, the main power supply (100) supplies power to the electronic component (106) of the electronic system (108) via power connection three (114) which is also connected to the clamping circuit (104). In an example, power connection three (114) may include a number of wires. For example, power connection three (114) may include two wires.

As illustrated, the system (100) includes the clamping circuit (104). In an example, the main power supply (110) is used to charge an energy storage section of a clamping circuit (110). As will be described in other parts of this specification the energy storage section may include a diode and a capacitor.

Further, the fault detector (102) may be used to determine that a power down sequence of an electronic system (108) has been activated. In an example, when the fault detector (102) has determined that a power down sequence of an electronic system (108) has been activated, the fault detector sends a clamp enable signal (112) to the clamping circuit (104).

Once the fault detector sends a clamp enable signal (112) to the clamping circuit (104), the clamping circuit (104) uses the energy stored in the energy storage section to activate the clamping circuit to control relative voltages on the power connection three (114) which supply power to the electronic component (106) during the power down sequence of the electronic system (108). As a result, proper voltage is applied to the electronic component (106) such that permanent damage is not caused to the electronic component (106) during the power down sequence. More information about the clamping circuit will be described in other parts of this specification.

While this example has been described with reference to the electronic component being memory such as DDR4 RAM, the electronic component may be any type of electronic component. For example, the electronic component may be an integrated circuit (IC). In an example, the IC may need to be supplied with multiple power supplies with specific voltage requirements and relationships during a power down sequence of an electronic system. This may be needed to prevent permanent damage to an electronic component caused during a power down sequence.

While this example has been described with reference to the main power supply, the fault detector, and the clamping circuit being located external to the electronic system, the main power supply, the fault detector, and the clamping circuit may be located internal to the electronic system. Further, combinations of the main power supply, the fault detector, and the clamping circuit may be located internal or external to the electronic system.

Figure 2:
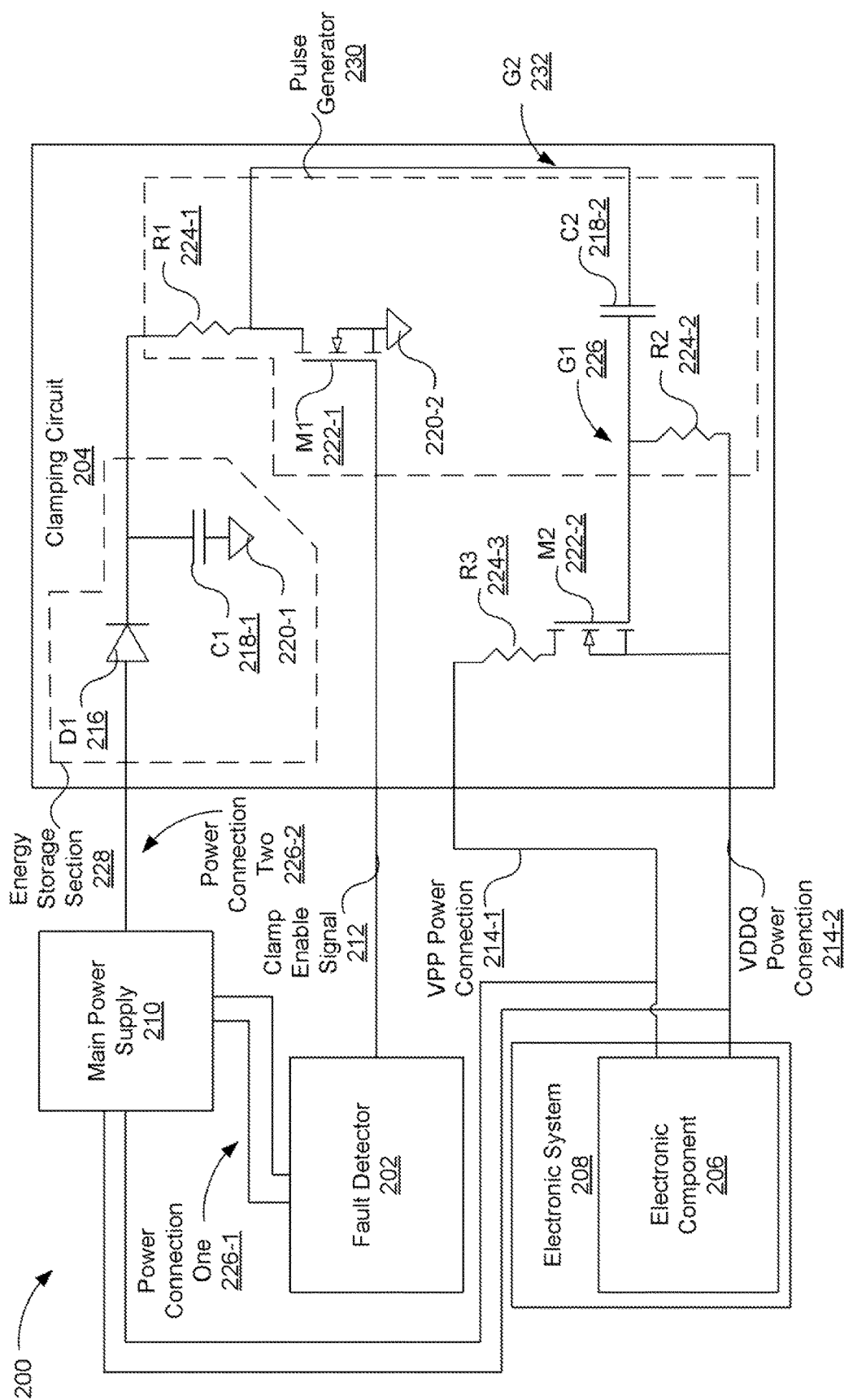
FIG. 2 is a diagram of an example of a system for controlling power connection voltage to an electronic component during a power down sequence of an electronic system, according to one example of principles described herein.

FIG. 2 is a diagram of an example of a system for controlling power connection voltage to an electronic component during a power down sequence of an electronic system, according to one example of principles described herein. As mentioned above, a clamping circuit may be used to for controlling voltage relationships between multiple electric power supplies to an electronic component during a power down sequence of an electronic system. The clamping circuit may include an energy storage section to store energy from a main power supply and a pulse generator to generate a pulse using the energy storage section to turn on the clamping circuit during a power down sequence of an electronic system.

As illustrated in FIG. 2, the system (200) includes an electronic system (208). As mentioned above, the electronic system (208) may be a computer, a mobile phone, a server, or another type of electronic system. As illustrated the electronic system (208) includes an electronic component (206). The electronic component (206) is used to perform specific functions of the electronic system (208). In an example, the electronic component (206) may be an IC. In another example, the electronic component (206) may be memory such as DDR4 RAM integrated circuits. As mentioned above, DDR4 RAM performs the function of storing data for the electronic system (208). In one example, the electronic component (206) may have specific voltage needs. If the specific voltage needs are not met, permanent damage may be caused to the electronic component (206). For example, one specific voltage need for DDR4 RAM is that a power supply input to the component, referred to as a VDDQ power input, is never to be higher in voltage than another power supply input to the component, referred to as the VPP power input, by more than 200 millivolts. This need is to be met during power up sequences, normal operation, and power down sequences. For example, the VDDQ power input for DDR4 RAM may be 400 mV and the VPP power input must be greater than 200 my. In this example, violations of these specific voltage needs may cause permanent damage to DDR4 RAM. For example, if the VDDQ power input is higher than the VPP power input by more than 200 mV, permanent damage may be caused to the DDR4 RAM. As will be described below, a clamping circuit (204) may be designed to meet specific voltage needs for the electronic component (206). As will be described below, the VDDQ power input is a VDDQ power connection (214-2) and VPP power input is a VPP power connection (214-1) for a clamping circuit (204).

As illustrated in FIG. 2, the system (200) includes a main power supply (210). As mentioned above, the main power supply (210) supplies power to the clamping circuit (204), a fault detector (202), the electronic component (206), or combinations thereof. In an example, the main power supply (210) may be, for example, a direct current (DC) power supply. In another example, the main power supply (210) may be, for example, a battery. In an example, the main power supply (210) may supply multiple specific voltage power supplies to the clamping circuit (204), the fault detector (202), the electronic component (206), or combinations thereof. For example, the main power supply (210) may supply power to the clamping circuit (204), the fault detector (202), or combinations thereof through multiple independent connections and at different voltage levels.

As illustrated in FIG. 2, the main power supply (210) supplies power through two power connections, such as VPP power connection (214-1) and VDDQ power connection (214-2), to the clamping circuit (204) and subsequently to electronic component (206). As will be described below, once the main power supply (210) is turned off, the VPP power connection (214-1) and the VDDQ power connection (214-2) supplies power to the electronic component (206) via the clamping circuit (204). Still further, the main power supply (210) supplies power to the fault detector (202) via power connection one (226-1). As mentioned above, the main power supply (210) also supplies power to the clamping circuit (204) through power connection two (226-2). In an example, power connection two (226-2) may be a 12V power connection.

In an example, the system (200) may include a number of separate power connections to supply power to the electronic system (208), the clamping circuit (204), the fault detector (202), or combinations thereof. For example, a first power supply may supply power to the electronic system (208) and the fault detector. Further, a second power supply may supply power to the clamping circuit (204).

Further, the main power supply (210) may supply power to the electronic component (206) of the electronic system (208) and the clamping circuit (204) in a parallel connection with the clamping circuit (204). For example, when the main power supply (210) is turned on, the voltages produced by the main power supply (210) is sent to the clamping circuit (204) and the electronic system (208) which encompasses the electronic component (206). Further, the state of the clamping circuit (204) when the main power supply (210) is on allows the power as produced by the main power supply (210) to power the electronic component (206). More information about the state of the clamping circuit (204) will be described in other parts of this specification.

As illustrated, the system (200) includes the clamping circuit (204). In an example, the clamping circuit (204) includes an energy storage section (228). In an example, the energy storage section (228) stores energy from a main power supply (210). Further, in an example, the energy storage section (228) includes a diode and a capacitor. In an example, the diode isolates a voltage produced by the main power supply (210) and the capacitor stores the voltage as energy.

As illustrated in FIG. 2, the energy storage section (228) includes D1 (216) as the diode and C1 (218-1) as the capacitor. As a result, D1 (216) isolates the voltage produced by the main power supply (210) and C1 (218-1) stores energy as a voltage and electric charge. As illustrated, C1 (218-1) is connected to D1 (216) and ground (220-1).

In an example, the energy storage section (228) is designed to meet the specific energy and voltage needs to enable the operation of the transistor M2 (222-2) such that permanent damage is not caused to the electronic component (206) during a power down sequence. In an example, if the electronic component (206) is DDR4 RAM, C1 (218-1) may be one microfarad (µF).

In an example, the clamping circuit (204) includes a pulse generator (230) to generate a pulse. In an example, the pulse generator (230) generates the pulse using the energy stored in the energy storage section (228) to turn on the clamping circuit (204) to control voltages on power connection three (214) to the electronic component (206) during a power down sequence of the electronic system (208). In an example, the pulse generator (230) generates the pulse using the energy storage section (228) to turn on the transistor M2 (222-2), thus connecting the two power supply conductors, VDDQ power connection (214-2) and VPP power connection (214-1) together through R3 (224-3) during the power down sequence of the electronic system (208) by receiving a clamping signal (212) from a fault detector (202). As illustrated in FIG. 2, the pulse generator (230) may include resistor R1 (224-1), capacitor C2 (218-2), a first transistor M1 (222-1), and resistor R2 (224-2). More information about the pulse generator (230) will be described in other parts of this specification.

In an example, the fault detector (202) monitors the main power supply (210). In an example, the fault detector (202) may monitor the main power supply (210) via common methods and techniques. In an example, if the main power supply (210) is supplying the proper voltages to the electronic system (208), the clamp enable signal (212) produced by the fault detector (202) is high. As a result, a clamp enable signal (212) that is high turns on a first transistor. In this example, the first transistor may be M1 (222-1). Since M1 (222-1) is turned on G2 (232) is at a low voltage level and G1 (226) is at a low voltage level resulting in transistor M2 (222-2) being turned off. In an example, G1 (226) and G2 (232) are nodes of the clamping circuit (204). The main power supply (210) will maintain the voltage levels of the VDDQ power connection (214-2) and VPP power connection (214-1) as needed by the electronic component (206) without connecting them together through R3 (224-3) and M2 (222-2). As a result, the main power supply (210) is used to power the electronic component (206).

In an example, the main power supply (210) may turn off as a result of a power down sequence. As a result, the fault detector (202) detects the electronic system (208) has activated a power down sequence, the clamp enable signal (212) produced by the fault detector (202) becomes low. In this example, when the clamp enable signal becomes low, M1 (222-1) turns off. Since the main power supply (210) is turned off and M1 (222-1) is turned off, the energy stored in C1 (218) begins to charge G2 (232). In this example, the energy stored in C1 (218) discharges through R1 (224-1) and onto G2 (232), and partially passes through C2 (218-2) causing the voltage on G1 (226) to rise, and slowly discharge through R2 (224-2). In an example, R1 (224-1) may be 50 kiloohms (K ohms), C2 (218-2) may be 4.7 µF, and R2 (224-2) may be 200K ohms. In an example, the values for R1 (224-1), C2 (218-2), and R2 (224-2) may be utilized with the clamping circuit (204). In other example, the values for R1 (224-1), C2 (218-2) and R2 (224-2) may be different depending on the specific voltage needs for the electronic component (206) and time constants for the decay of voltages within the electronic system (208).

In an example, the pulse generator (230) generates the pulse at a specific range voltage and for a specific duration of time. In an example, the pulse may be, for example, 12 V for 2 milliseconds (ms). In another example, the pulse may be 5 V for 10 ms. In an example, the specific voltage and the specific duration of time for the pulse depends on the values of R1 (224-1), R2 (224-2), C2 (218-2), R1 (224-1), and C1 (218-1). In an example, the values of R1 (224-1), R2 (224-2), and C2 (218-2) may be designed for the electronic component (206) being DDR4 RAM. As a result, the values of R1 (224-1), R2 (224-2), and C2 (218-2) may be designed such that the pulse meets a specific voltage and a specific duration of time.

In an example, the clamping circuit (204) includes the VDDQ power connection (214-2) and VPP power connection (214-1). In one example, the VDDQ power connection (214-2) and VPP power connection (214-1) are connected to multiple power supplies of an electronic component (206). Further, VDDQ power connection (214-2) and VPP power connection (214-1) may include a number of wires to power the electronic component (206). As mentioned above, the electronic component (206) may need to meet specific voltage needs, especially during a power down sequence of the electronic system (208), or permanent damage may be caused to the electronic component (206). For example, if the electronic component (206) is DDR4 RAM, one specific voltage need for DDR4 RAM is that the voltage for the VDDQ power connection (214-2) is never higher than the voltage of the VPP power connection (214-1) by more than 200 mV. In this example, violations of these voltage needs may cause permanent damage to electronic component (206). For example, if the voltage of the VDDQ power connection (214-2) is higher than the voltage of the VPP power connection (214-1), permanent damage may be caused to the electronic component (206).

In an example, the clamping circuit (204) clamps the VDDQ power connection (214-2) and VPP power connection (214-1) together during a power down sequence. In one example, the clamping circuit (204) clamps the VDDQ power connection (214-2) and VPP power connection (214-1) together as long as point G1 (226) has a positive voltage applied. In one example, if point GI (226) has an adequate positive voltage applied, a second transistor. M2 (222-2), is turned on. If M2 (222-2) is turned on, VDDQ power connection (214-2) and VPP power connection (214-1) are tied together through R3 (224-3) preventing them from separating in voltage such that the voltage of VDDQ power connection (214-2) becomes more than 200 mV higher in voltage than the voltage for VPP power connection (214-1). In an example, R3 (224-3) may be 2 ohms. Such a clamping circuit (204) allows an electronic component (206) to be supplied with multiple voltage supplies during a power down sequence of the electronic system (208) without violating the relative voltage needs. As a result, the electronic component (206) may not be permanently damaged during a power down sequence.

An overall example, of the system (200) will now be described. In an example, the main power supply (210) may be turned on. By powering the main power supply (210), the fault detector (202) determines the electronic component (206) is receiving power. As a result, the fault detector (202) produces a clamp enable signal (212) that is high. As mentioned above, a damp enable signal (212) that is high turns on a first transistor. In this example, M1 (222-1) is turned on. In an example, since the M1 (222-1) is turned on and the main power supply (210) is turned on, the energy storage section (228) of a clamping circuit (204) may be charged. As a result, C1 (218-1) is charged. Further, while the main power supply (210) is turned on, the main power supply (210) supplies power to the electronic component (206) without interference by the clamping circuit (204).

In an example, a power down sequence of an electronic system (208) may become activated. During the power down sequence of an electronic system (208), the main power supply (210) is turned off. As mentioned above, the fault detector (202) determines that a power down sequence of an electronic system (208) has been activated. As a result, the fault detector (202) produces a damp enable signal (212) that is low. As mentioned above a clamp enable signal (212) that is low turns off the first transistor. In this example, M1 (222-1) is turned off. In an example, since the M1 (222-1) is turned off and the main power supply (210) is turned off, the energy storage section may be used generate a pulse to supply power to the electronic component (206) during the power down sequence of the electronic system (208).

In one example, the clamp enable signal (212) that is low turns off M1 (222-1) to allow G2 (232) to increase in voltage. In this example, the voltage stored in the energy storage section (228) charges G2 (232) through resistor R1 (224-1). As the voltage on G2 (232) increases, a current flows through capacitor C2 (218-2) and increases the voltage on G1 (226). Further, resistor R2 (224-2) drains charge off G1 (226) over the needed pulse width in time. While G1 (226) is at a high enough voltage, transistor M2 (222-2) is turned on As mentioned above, as long as point G1 (226) has a positive voltage applied. VDDQ power connection(214-2) and VPP power connections (214-1) are precluded from separating in voltage such that the needs of the electronic component (206) are met during this power down sequence. Once the energy storage section (228) has completely discharged, M2 (222-2) is turned off when the resistor R2 (224-2) drains off enough charge from G1 (226) to lower the voltage between the gate and source of transistor M2 (222-2) to the point that the transistor M2 (222-2) turns off. As a result, the electronic component (206) may not be permanently damaged during a power down sequence.

While this example has been described with reference to the electronic component being memory such as DDR4 RAM, the electronic component may be any type of electronic component. For example, the electronic component may be an IC. In an example, the IC may need to be supplied with power through power connections that require multiple voltage levels and may require the relative voltages to be maintained in specific relationships during a power down sequence of an electronic system such that permanent damage is not caused during a power down sequence.

While this example has been described with reference to the main power supply, the fault detector, and the clamping circuit being located external to the electronic system, the main power supply, the fault detector, and the clamping circuit may be located internal to the electronic system. Further, combinations of the main power supply, the fault detector, and the clamping circuit may be located internal or external to the electronic system.

Figure 3:
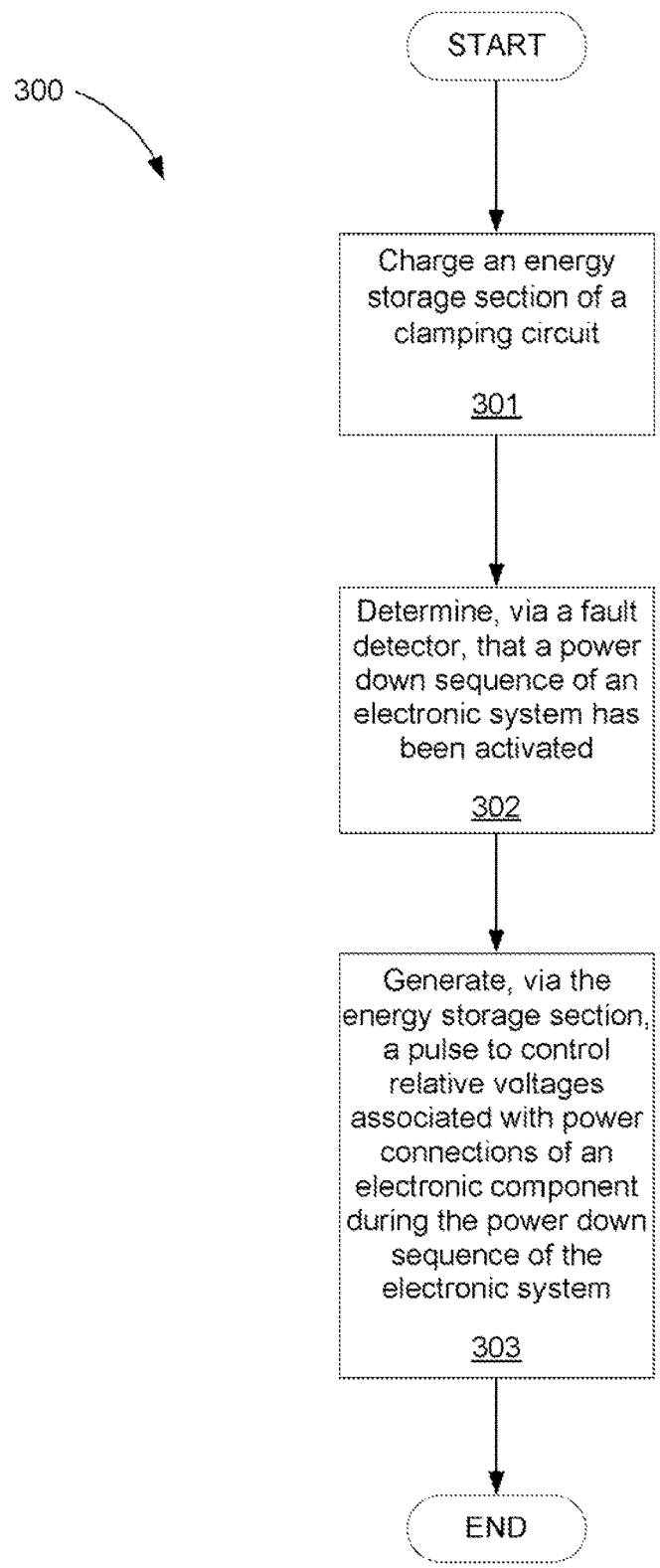
FIG. 3 is a flowchart of an example of a method for controlling power connection voltage to an electronic component during a power down sequence of an electronic system, according to one example of principles described herein.

FIG. 3 is a flowchart of an example of a method for controlling power connection voltage to an electronic component during a power down sequence of an electronic system, according to one example of principles described herein. In one example, the method (300) may be executed by the system (100) of FIG. 1. In other examples, the method (30) may be executed by other systems such as system 200. In this example, the method (300) includes charging (301)

an energy storage section of a clamping circuit, determining (302), via a fault detector, that a power down sequence of an electronic system has been activated, and generating (303), via the energy storage section, a pulse to control relative voltages associated with power connections of an electronic component during the power down sequence of the electronic system.

As mentioned above, the method (300) includes charging (301) an energy storage section of a clamping circuit, in one example, charging the energy storage section of the clamping circuit includes charging a capacitor via a main power supply isolated through a diode of the clamping circuit. As mentioned above, the capacitor's ability to discharge a voltage may vary depending on the specific voltage needs of an electronic component. As a result, the energy storage section may be designed to meet the specific voltage needs of any electronic component.

As mentioned above, the method (300) includes determining (302), via a fault detector, that a power down sequence of an electronic system has been activated. In an example, if a main power supply supplies power to an electronic system, the fault detector determines the electronic system is not in a power down sequence. As a result, the fault detector sends a clamp enable signal that is high to the clamping circuit. In another example, if a main power supply turns off and no longer supplies power to an electronic system, the fault detector determines the electronic system is in a power down sequence. As a result, the fault detector sends a clamp enable signal that is low to the clamping circuit. As mentioned above, common methods and techniques may be used to design the fault detector.

As mentioned above, the method (300) includes generating (303), via the energy storage section, a pulse to control relative voltages associated with power connections of an electronic component during the power down sequence of the electronic system. In an example, generating, via the energy storage section the pulse to control the relative voltages associated with the power connections of the electronic component during the power down sequence of the electronic system includes sending a clamp enable signal that is low from the fault detector to a first transistor, the clamp enable signal that is low turns off the first transistor to allow the energy storage section to supply energy to the portion of the clamping circuit that controls voltage of the power connection. As mentioned above, the energy storage section may provide control in the form of a pulse of energy of limited time duration. In an example, pulse generator generates the pulse at a specific voltage range and for a specific range of duration of time.

As mentioned above, during the power down sequence of the electronic system, a first transistor is turned off and a second transistor is turned on for a period of time adequate to insure that that the power connections, such as a VPP power connection and a VDDQ power connection of FIG. 2, cannot change in voltage relative to each other enough to violate the needs of the electronic component. Further, a number of power connections may be connected to such a clamping circuit to multiple power supply connection voltage of electronic component. In an example, the clamping circuit clamps the power connections, such as a VPP power connection and a VDDQ power connection of FIG. 2, together. As a result, the clamping circuit prevents the electronic component to be supplied with a multiple power connections voltages during a power down sequence of the electronic system which would violate the needs of the electronic component. Further, the electronic component may not be permanently damaged during a power down sequence.

The preceding description has been presented to illustrate and describe examples of the principles described. This description is not intended to be exhaustive or to limit these principles to any precise form disclosed. Many modifications and variations are possible in light of the above teaching.

What is claimed is:

1. A clamping circuit, the clamping circuit comprising:
an input line to receive power from a power supply;
an energy storage section to store energy from the power supply;
an input to receive a signal from a fault detector indicative of a state of the power supply;
two output lines for connection to different voltage input lines of an electronic system; and
a pulse generator to generate a pulse of energy on the two output lines using the stored energy in the energy storage section in response to the fault detector signal;
the clamping circuit to clamp voltages of the two output lines together using a transistor connected to both of the two output lines to allow the pulse generator to maintain voltages of the two output lines within a predetermined amount from each other.

2. The clamping circuit of claim 1, in which the pulse generator generates the pulse using the energy storage section in response to the fault detector signal indicating a power down sequence of the electronic system.

3. The clamping circuit of claim 2, in which the pulse generator generates the pulse using the energy storage section to provide clamped voltages on the two output lines for a predetermined time to enable the power down sequence of the electronic system without damage to the electronic system.

4. The clamping circuit of claim 1, in which the clamping circuit comprises a resistor, through which one of the output lines is connected to the transistor, that clamps the two output lines so that a set voltage difference is maintained between the two output lines.

5. The clamping circuit of claim 1, in which the pulse generator generates the pulse at a specific voltage range and for a specific duration of time.

6. The clamping circuit of claim 1, in which the energy storage section comprises a diode and a capacitor, the diode isolating a voltage produced by the power supply and the capacitor storing the voltage as energy.

7. The clamping circuit of claim 1, the pulse generator comprising a first transistor connected to receive the fault detector signal.

8. The clamping circuit of claim 7, wherein a gate of the first transistor is connected to ground.

9. The clamping circuit of claim 1, wherein the pulse generator comprises a resistor and capacitor in series to receive energy from the energy storage section.

10. The clamping circuit of claim 9, wherein the capacitor of the pulse generator is connected to the transistor.

11. The clamping circuit of claim 10, wherein the transistor turns off when the capacitor of the pulse generator is drained of charge.

12. The clamping circuit of claim 11, wherein a gate of the transistor is connected to the capacitor of the pulse generator.

13. The clamping circuit of claim 1, wherein the two output lines comprise a VDDQ power input and a VPP power input for a memory.

14. The clamping circuit of claim 1, wherein the clamping circuit maintains a different in voltage between the two output lines at 200 mV or less.

15. The clamping circuit of claim 1, wherein the two output lines are power inputs for an integrated circuit.

16. A method for controlling power connection voltages to an electronic component during a power down sequence of an electronic system, the method comprising:
    charging an energy storage section of a clamping circuit from a power supply;
    determining, via a fault detector monitoring a state of the power supply, that the power down sequence of the electronic system has been activated; and
    generating, via the energy storage section, a pulse of energy to provide power to two output lines of the clamping circuit connected to different voltage input lines of the electronic component during the power down sequence; and
    clamping voltages of the two output lines together using a transistor connected to both of the two output lines to allow the pulse of energy to maintain voltages of the two output lines within a predetermined amount from each other during the power down sequence of the electronic system.

17. The method of claim 16, in which charging the energy storage section of the clamping circuit comprises charging a capacitor via the power supply isolated through a diode of the clamping circuit.

18. The method of claim 16, in which generating, via the energy storage section, the pulse comprises:
    sending a clamp enable signal that is low from the fault detector to a first transistor, the clamp enable signal that is low turns off the first transistor to allow the energy storage section to discharge the pulse; and
    supplying, via the pulse, energy to the electronic component during the power down sequence of the electronic system until the energy storage section is discharged.

* * * * *